(12) United States Patent
Luo et al.

(10) Patent No.: US 8,644,025 B2
(45) Date of Patent: Feb. 4, 2014

(54) INTEGRATED CIRCUIT FILM FOR SMART CARD

(75) Inventors: Huan Chin Luo, Hsinchu (TW); Hua Ting Chang, Hsinchu (TW); Chin Sheng Lin, Hsinchu (TW); Chih Cheng Lin, Hsinchu (TW); Chung Pei Hung, Hsinchu (TW)

(73) Assignee: Mxtran Inc., Hsinchu (TW)

( * ) Notice: Subject to any disclaimer, the term of this patent is extended or adjusted under 35 U.S.C. 154(b) by 301 days.

(21) Appl. No.: 12/976,714

(22) Filed: Dec. 22, 2010

(65) Prior Publication Data

US 2011/0149533 A1 Jun. 23, 2011

(30) Foreign Application Priority Data

Dec. 22, 2009 (TW) .............................. 098144154
Aug. 12, 2010 (TW) .............................. 099215445
Nov. 1, 2010 (TW) .............................. 099221068

(51) Int. Cl.
*H05K 1/14* (2006.01)
(52) U.S. Cl.
USPC .................................... 361/737; 361/715
(58) Field of Classification Search
USPC ........... 361/737, 715, 721, 760; 257/676, 677
See application file for complete search history.

(56) References Cited

U.S. PATENT DOCUMENTS

| | | | | |
|---|---|---|---|---|
| 4,862,153 A * | 8/1989 | Nakatani et al. | ................. | 345/80 |
| 5,966,115 A * | 10/1999 | Aoki | .............................. | 345/204 |
| 6,560,117 B2 * | 5/2003 | Moon | ............................ | 361/749 |
| 6,675,470 B2 * | 1/2004 | Muramatsu | ..................... | 29/832 |
| 7,144,257 B2 * | 12/2006 | Yumoto et al. | .................. | 439/67 |
| 7,198,199 B2 | 4/2007 | Ho | | |
| 7,271,860 B2 * | 9/2007 | Fukuta et al. | ................... | 349/58 |
| 7,303,137 B2 | 12/2007 | Ho | | |
| 7,546,671 B2 * | 6/2009 | Finn | ............................ | 29/592.1 |
| 7,652,359 B2 * | 1/2010 | Takayama et al. | ............ | 257/679 |
| 2006/0163728 A1 * | 7/2006 | Nakanishi et al. | ............ | 257/738 |
| 2007/0262156 A1 | 11/2007 | Chen et al. | | |
| 2009/0061933 A1 | 3/2009 | Lo et al. | | |
| 2009/0250250 A1 * | 10/2009 | Ishii | ............................. | 174/254 |
| 2010/0190528 A1 * | 7/2010 | Hsiao et al. | .................... | 455/558 |
| 2012/0049309 A1 * | 3/2012 | Kiyomoto et al. | ............ | 257/434 |

FOREIGN PATENT DOCUMENTS

TW 288959 3/2006
TW 276002 3/2007

OTHER PUBLICATIONS

Web Page, "Taisys Makes Debut of World's First Commercialized Mobile Proximity Payment Solution for MRT Applications", http://taisysgroup.com/newsevents_071130.html#, Nov. 30, 2007.
Web Page, "V-Tone Card", http://www.vibo.com.tw/CWS/Consumer_05_08_08,,,,.html, 2007.

* cited by examiner

*Primary Examiner* — Hung S Bui
(74) *Attorney, Agent, or Firm* — Liu & Liu

(57) ABSTRACT

An integrated circuit (IC) film for a smart card is provided. The IC film includes a flexible printed circuit (FPC) board, first electrical contacts, second electrical contacts, and an IC chip. The first electrical contacts are disposed on a first side of the FPC board, and the second electrical contacts are disposed on a second side of the FPC board. The IC chip is disposed on the FPC board and bonded to the leads of the FPC board to thereby form electrical connection. The total thickness of the FPC board and the chip is not larger than 0.5 mm.

20 Claims, 11 Drawing Sheets

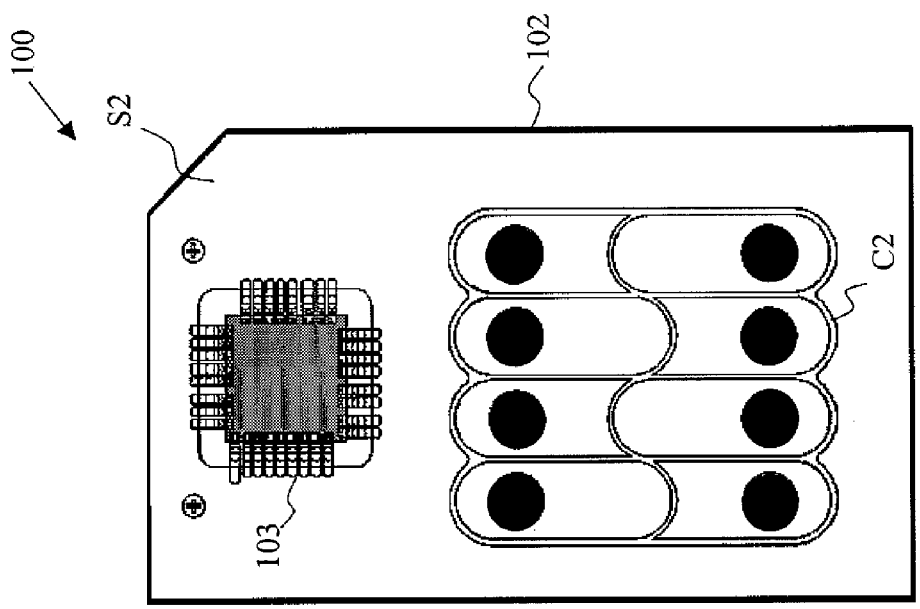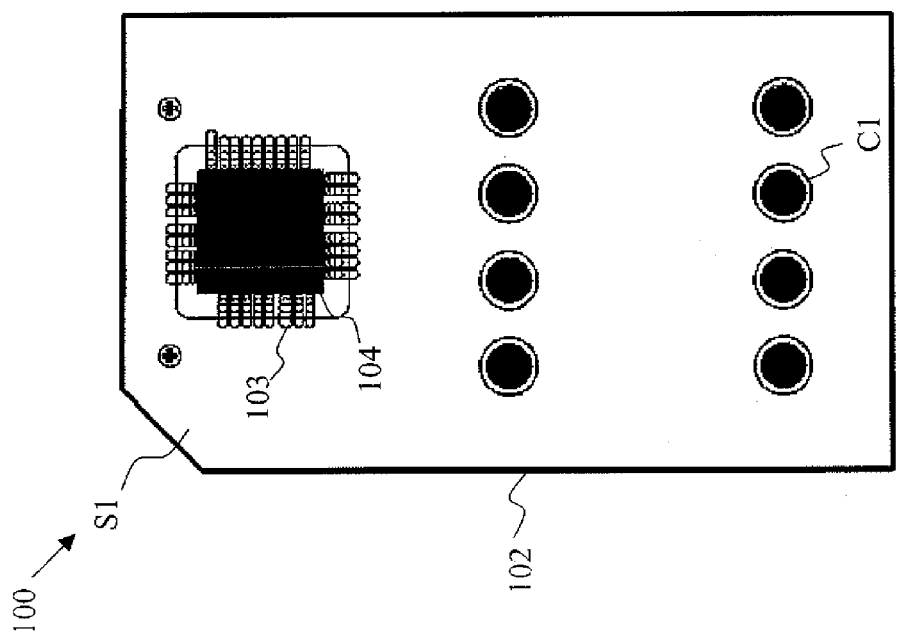
FIG.1

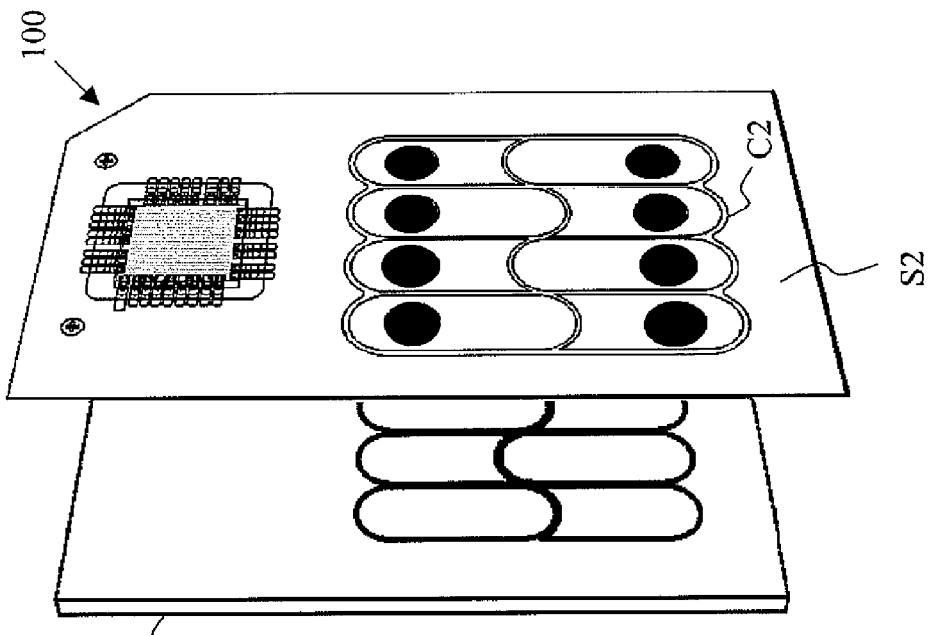
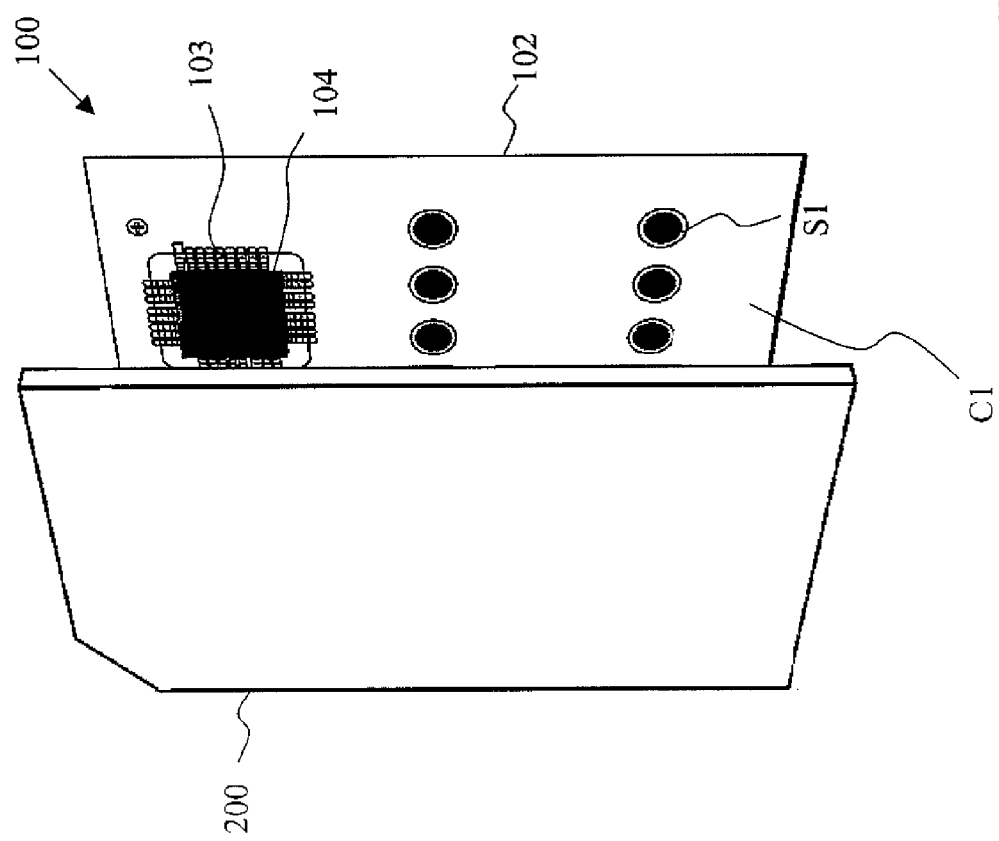
FIG.3

US 8,644,025 B2

INTEGRATED CIRCUIT FILM FOR SMART CARD

BACKGROUND OF THE INVENTION

1. Field of the Invention

The present invention relates to an integrated circuit (IC) film for a smart card.

2. Description of the Prior Art

Given existing technology, functions or communication services (such as mobile Internet banking services) available to mobile phones usually depend on whether there is any support from a SIM/USIM card. In this regard, to overcome limitations caused by conventional SIM/USIM cards, the industrial sector has proposed related technical solutions, such as Taiwan Patent Application No. 94106675 entitled "Dual Universal IC Card (UICC) System for a Portable Device," Taiwan Patent Application No. 94217529 entitled "Dual IC Card System," U.S. Published Patent Application US2007/0262156 entitled "Functional Module Improvement Structure for Expanded and Enhanced SIM Card," and U.S. Published Patent Application US2009/0061933 entitled "Multiple Interface Card in a Mobile Phone".

Furthermore, there are commercially available SIM/USIM card films for use with mobile phones, such as the V-Tone Card launched into the market by VIBO Telecom, Inc. (for further details, please refer to http://www.vibo.com.tw/CWS/Consumer_05_08_08,,,,.html). The V-Tone card or the like is primarily a film. Users affix the film to a conventional SIM card, put the film-affixed SIM Card in a mobile phone, and then select the STK options of the mobile phone, to use functions or application programs which are otherwise not provided by the original SIM card. For further details about the aforesaid thin film, please refer to U.S. Pat. Nos. 7,198,199, 7,303,137 or Taiwan Patent Application No. 98144154, especially the description of an integrated circuit (IC) film disclosed therein.

However, the aforesaid technology is subjected mostly to limitations of the structure and configuration of mobile phones, entails performing additional processing work on the original SIM card, for example, punching a hole in the SIM card or cutting the SIM card, or even requires services from special technical personnel in order to finish the aforesaid procedure. Hence, the application of the aforesaid technology is inconvenient. Also, in some countries, the aforesaid processing work even requires approval from the telecommunications company issuing the SIM card.

SUMMARY OF THE INVENTION

An integrated circuit (IC) film according to an embodiment of the present invention is characterized in that: an IC chip dispenses with a conventional packaging step, and, in particular, it need not be covered with any package molding material. The IC chip is directly mounted on a flexible printed circuit (FPC) board, thus resulting in reduction of thickness. Also, coupling the IC chip and a smart card together does not require performing additional processing work on the smart card, for example, punching a hole in the SIM card or cutting the SIM card, but it is still feasible to access data by means of card reading devices or slots for use with the smart card in general. Note that in some other embodiment, the IC chip could be covered with a thin layer of package molding material.

The IC film according to an embodiment of the present invention is further characterized in that: the IC chip is, for integration purpose, disposed between at least two contacts on one side of an IC film in order to reduce the area required for the IC film. Also, the IC chip is disposed between the contacts and thus protected by the surrounding contacts, such that the IC chip is free from abrasions and wears.

The IC film according to an embodiment of the present invention is further characterized in that: the IC film has a flexible portion for bending the flexible printed circuit (FPC) board until the FPC board is C-shaped when the IC film is affixed to the smart card; an IC chip and the contacts configured for connection with the smart card are disposed on opposing sides of the smart card. Accordingly, the area required for the circuit laid out on the IC film is not subject to the limitation of the area of the smart card, not to mention that there is a relatively large allowable tolerance of the thickness of the IC chip.

One can gain insight into the features and advantages of the present invention by making reference to the following description, the appended claims, and the embodiments of the present invention as described hereunder.

BRIEF DESCRIPTION OF THE SEVERAL VIEWS OF THE DRAWINGS

To allow persons skilled in the art to gain insight into the advantages of the present invention immediately, specific detailed embodiments are illustrated with the appended drawings to give a detailed explanation of the above brief description of the present invention. The drawings are intended to illustrate typical specific embodiments of the present invention but are not deemed to be restrictive of the scope of the present invention. The present invention is hereunder described with extra definiteness and details in conjunction with the accompanying drawings, in which:

FIG. 1 is a front view of an IC film according to a specific embodiment of the present invention;

FIG. 3 is a schematic view of an IC film and a smart card according to a specific embodiment of the present invention;

DETAILED DESCRIPTION OF THE EMBODIMENTS OF THE INVENTION

First Embodiment

Figure 2:
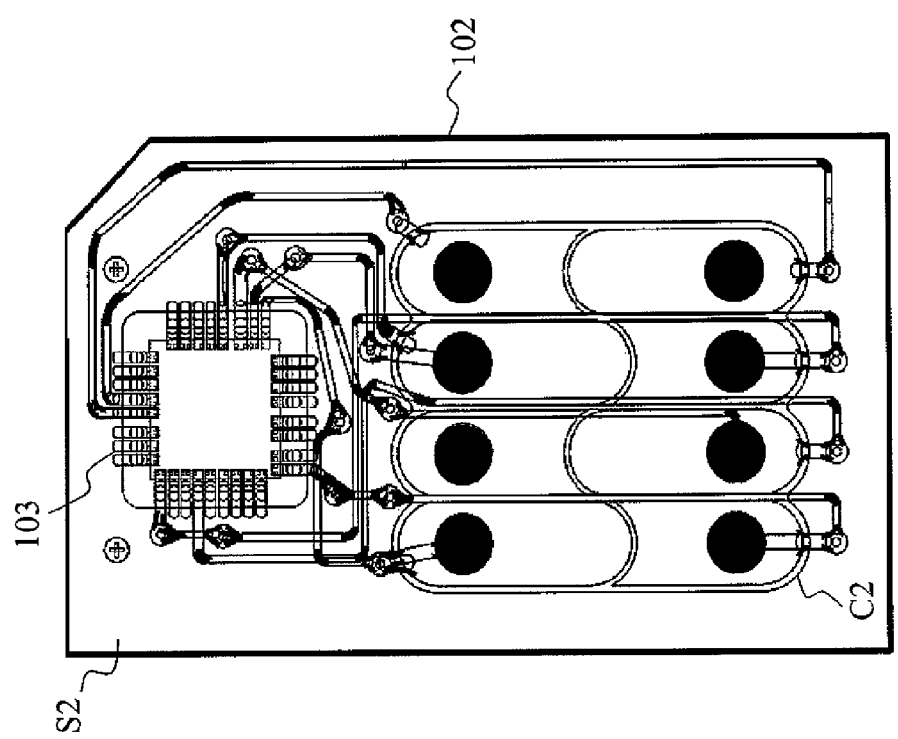
FIG. 2 is a schematic view of a flexible printed circuit (FPC) board according to a specific embodiment of the present invention.

FIG. 1 shows a front view and a back view of an integrated circuit (IC) film 100 according to a specific embodiment of the present invention. The IC film 100 comprises a flexible printed circuit (FPC) board 102, first electrical contacts C1, second electrical contacts C2, and an integrated circuit (IC) chip 104. The FPC board 102 has a first side S1 and a second side S2 opposite the first side S1. The first electrical contacts C1 are disposed on the first side S1 and configured for electrical connection with a smart card 200 (shown in FIG. 3). The second electrical contacts C2 are disposed on the second side S2. The IC chip 104 is disposed on the FPC board 102, and is bonded to leads 103 of the FPC board 102 and thus electrically connected thereto.

FIG. 2 shows a front view of the FPC board 102. As shown in FIG. 2, the first electrical contacts C1 are disposed on the first side S1, the second electrical contacts C2 are disposed on the second side S2, and the IC chip 104 are electrically connected by means of a circuit laid out on the FPC board 102. The circuit of the FPC board 102 is a printed circuit or a circuit formed by chemical deposition.

As shown in FIG. 1 and FIG. 2, the first electrical contacts C1 on the first side S1 each have a convex-point structure (see also FIG. 4), and the second electrical contacts C2 on the second side S2 each have a concave-point structure, with both structures being located at corresponding positions on the FPC board 102. However, the aforesaid disclosure does not limit the present invention. In other embodiments not shown, the first electrical contacts C1 and the second electrical contacts C2 can be located at non-corresponding positions or can be of different shapes and structures, provided that: the first electrical contacts C1 can be in electrical contact with the intended smart card; and the second electrical contacts C2 can be in electrical contact with an access device (not shown) for use with the smart card.

Preferably, as shown in FIG. 1 and FIG. 2, the structure and position of the first electrical contacts C1 conform to the ISO7816-2 standard, such that the first electrical contacts C1 can be electrically connected to the smart card in accordance with the ISO7816 standard. Also, the structure and position of the second electrical contacts C2 conform to the ISO7816-2 standard, such that the second electrical contacts C2 can be electrically connected to an access device (such as a smart card reader or a SIM/USIM card slot of a mobile phone) for use with the smart card in accordance with the ISO7816 standard.

Figure 4:
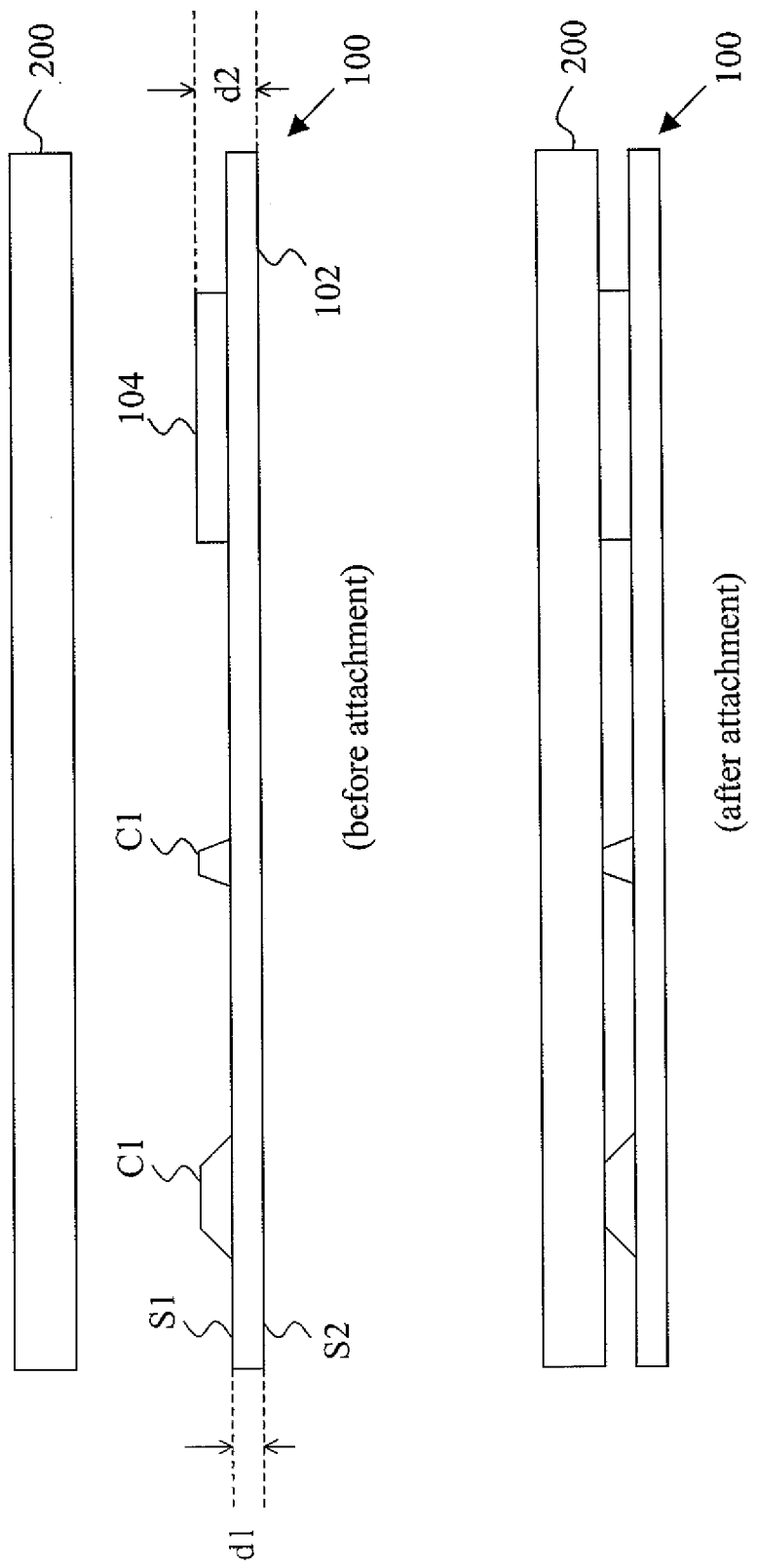
FIG. 4 is a side view of an IC film and a smart card according to a specific embodiment of the present invention.

As shown in FIG. 3 and FIG. 4, the IC chip 104 is preferably disposed on the first side S1, that is, the side facing the smart card 200. The first side S1 has a double-sided adhesive tape (such as 3M™ thin-film VHB™ adhesive tape F-9460PC) for adhering to the surface of the smart card 200. Once the IC film 100 is attached to the smart card 200, the IC chip 104 will lie completely outside the surface of the smart card 200. In doing so, although the IC chip 104 is not covered with any package molding material, the IC chip 104 is protected by the smart card 200 and the FPC board 102. However, the aforesaid disclosure does not limit the present invention, as it is also feasible for the IC chip 104 to be disposed on the second side S2.

The IC chip 104 is directly bonded to the leads 103 of the FPC board 102 by means of an anisotropic conductive film (ACF). Alternatively, the IC chip 104 is bonded to the leads 103 of the FPC board 102 by means of gold-to-gold interconnection (GGI). In this embodiment, the IC chip 104 is not covered with any package molding material (such as epoxy resin). Preferably, the IC chip 104 is only coated with a UV adhesive layer for enhancing fixation, thereby reducing the thickness of the IC chip 104 greatly. As a result, it is not necessary to perform additional processing work (such as punching a hole in the smart card or cutting the smart card) on the smart card 200 when the IC film 100 is affixed to the smart card 200. The aforesaid disclosure should not limit the present invention, as the integrated circuit chip 104 may also be covered with a package molding material. If the IC chip 104 is covered with a package molding material, it will be feasible for the IC chip 104 to be bonded to the leads 103 of the FPC board 102 by means of a solder ball array instead of the aforesaid anisotropic conductive film (ACF) or gold-to-gold interconnection (GGI).

As shown in FIG. 4, the total thickness d2 of the FPC board 102 and the IC chip 104 is not larger than 0.5 mm, and is preferably not larger than 0.4 mm, whereas the thickness d1 of the FPC board 102 is not larger than 0.2 mm, and is preferably 0.15 mm approximately. In general, the smart card 200 is of a thickness between 0.75 mm and 0.8 mm.

Second Embodiment

The second embodiment is hereunder illustrated with the IC film for a micro SIM card. Micro SIM Card is a Mini-UICC smart card of dimensions 12 mm×15 mm approximately. For further details about the Mini-UICC smart card, please refer to regulations of European Telecommunications Standards Institute (ETSI) regarding smart cards, UICC-Terminal interface, and physical and logical characteristics. The present invention is also applicable to the UICC smart card.

Figure 5:
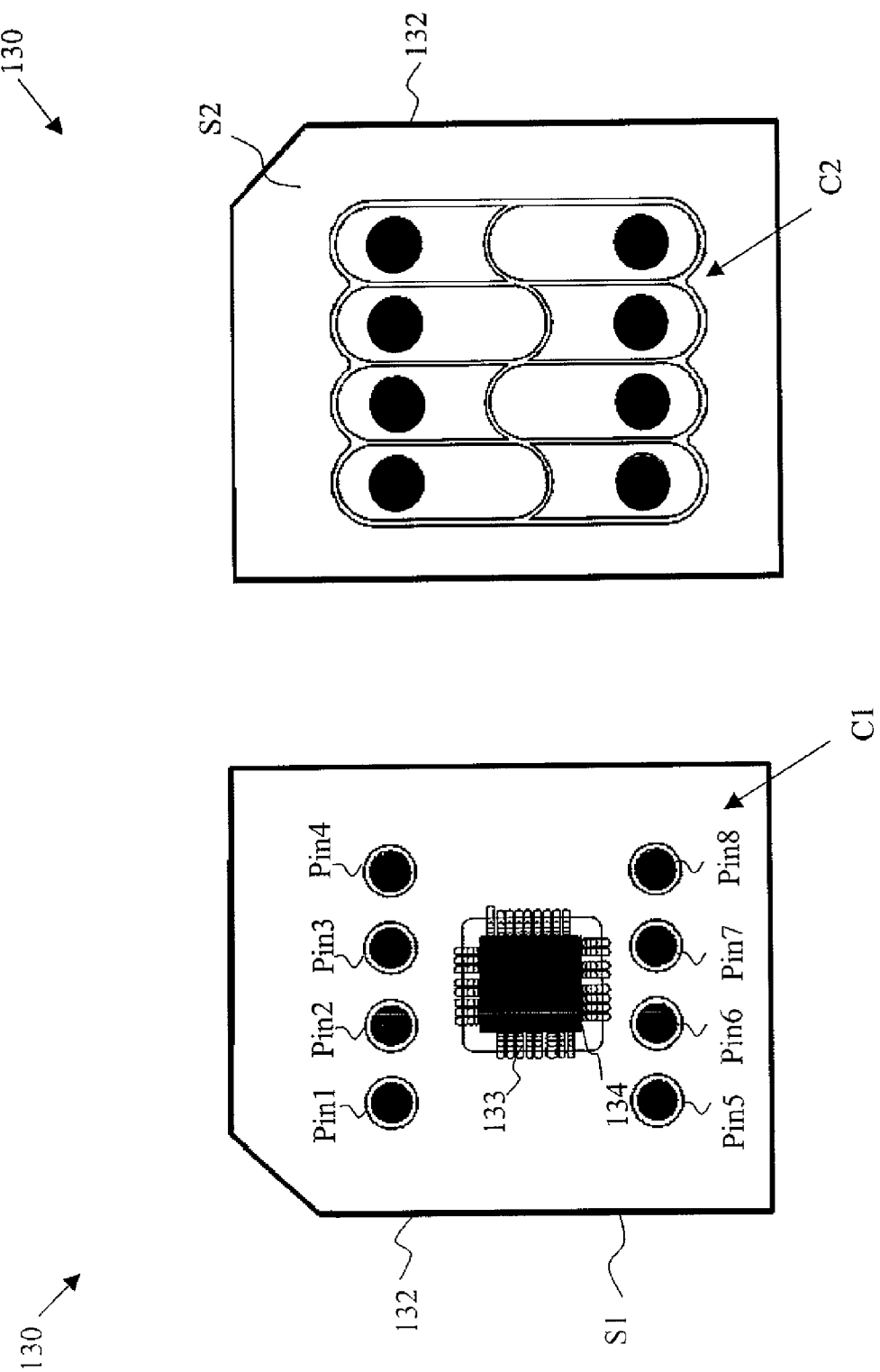
FIG. 5 is a schematic view of an IC film according to another specific embodiment of the present invention.

FIG. 5 shows a front view and a back view of an IC film 130 according to an embodiment of the present invention. The IC film 130 comprises a flexible printed circuit (FPC) board 132, the first electrical contacts C1, the second electrical contacts C2, and an IC chip 134. The FPC board 132 has the first side S1 and the second side S2 opposite the first side S1. The first electrical contacts C1 are disposed on the first side S1. The second electrical contacts C2 are disposed on the second side S2. In this embodiment, the first electrical contacts C1 on the first side S1 each have a convex-point structure and are configured for electrical connection with a smart card 230 (shown in FIG. 6 and FIG. 7), while the second electrical contacts C2 on the second side S2 each have a concave-point structure, with both structures being located at corresponding positions on the FPC board 132. In this embodiment, the IC chip 134 is disposed on the first side S1 of the FPC board 132 and bonded to leads 133 of the FPC board 132 to thereby form electrical connection. However, in other embodiments not shown, the IC chip 134 can also be disposed on the second side S2 of the FPC board 132.

However, the aforesaid disclosure does not limit the present invention. In other embodiments not shown, the first electrical contacts C1 and the second electrical contacts C2 can be located at non-corresponding positions or can be of different shapes and structures, provided that: the first electrical contacts C1 can be in electrical contact with the intended smart card; and the second electrical contacts C2 can be in electrical contact with an access device (not shown) for use with the smart card.

Preferably, as shown in FIG. 5, the structure and position of the first electrical contacts C1 conform to the ISO7816-2 standard, such that the first electrical contacts C1 can be electrically connected to the smart card in accordance with the ISO7816 standard. Also, the structure and position of the second electrical contacts C2 conform to the ISO7816-2 standard, such that the second electrical contacts C2 can be electrically connected to an access device (such as a smart card reader or a SIM/USIM card slot of a mobile phone) for use with the smart card in accordance with the ISO7816 standard.

In addition, to reduce the required area of the IC film 130 and, in particular, cope with a relatively small-sized smart card (such as Micro SIM Card), it is preferably feasible to dispose the IC chip 134 at a region between contacts on a side of the IC film 130. Generally speaking, the region is least likely to be dispensed with, as far as the IC film 130 is concerned. As shown in FIG. 5, in accordance with the ISO7816-2 standard, the first electrical contacts C1 on the first side S1 include eight contacts (pins 1-8), and the IC chip 134 is positioned at a region between the contact pins 1-4 and the contact pins 5-8. The region is of dimensions of 7.62 mm×9.32 mm. Areas outside the contact pins 1-4 and the contact pins 5-8 can be cut down or cut out as needed. The aforesaid measures are particularly necessary for the smart card 230 that comes in the form of the Micro SIM card or the Mini UICC card. The area of the smart card 230 is as small as 12 mm×15 mm and thus decreases to scarcity when areas required for electrical contact is not included. In this regard, the aforesaid embodiment offers an efficient problem-solving solution. A point to note is that, in the embodiment illustrated with FIG. 5, the present invention discloses at least two contacts disposed on a side of the IC film 130, and discloses the IC chip 134 disposed at a region between the contacts; despite the aforesaid disclosure, the present invention does not limit the quantity of the contacts or the functions provided by the contacts.

Figure 6:
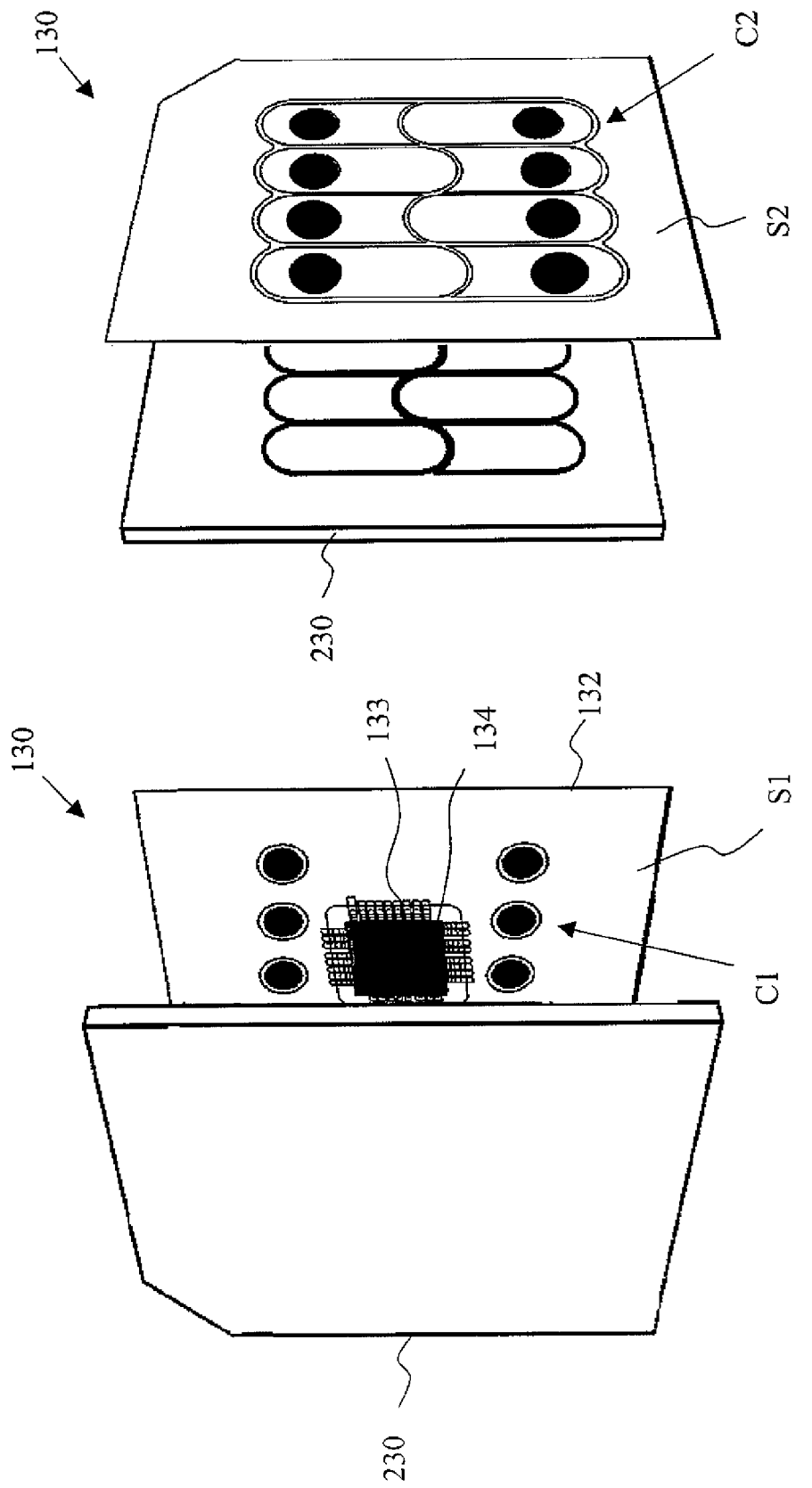
FIG. 6 is a schematic view of an IC film and a smart card according to another specific embodiment of the present invention.
Figure 7:
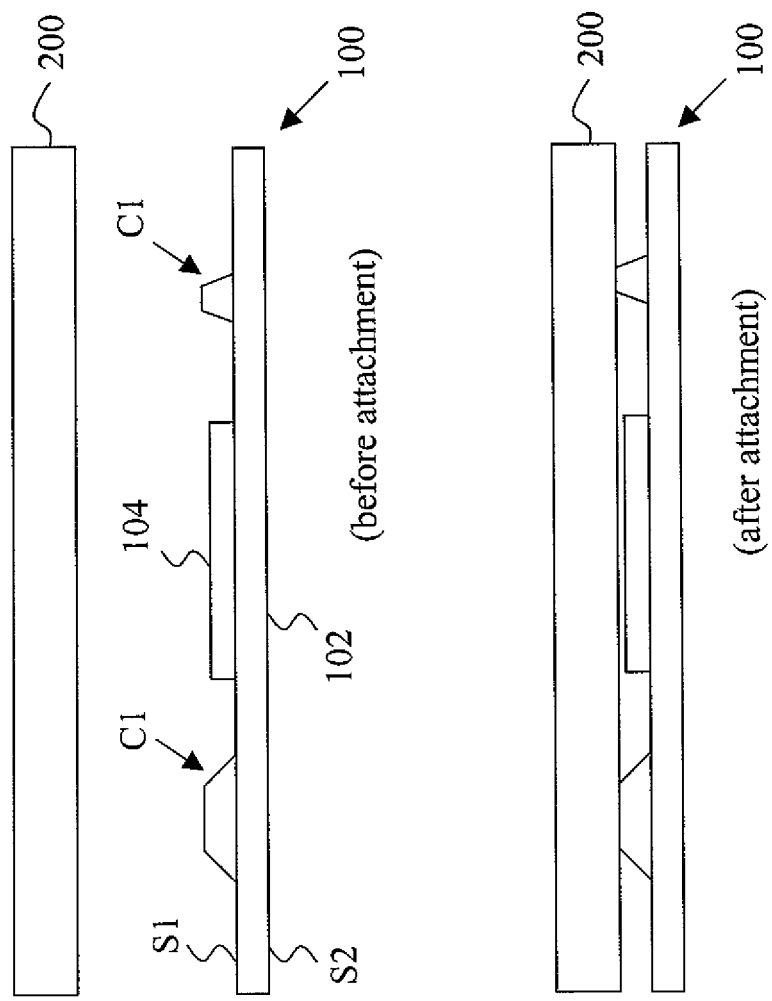
FIG. 7 is a side view of an IC film and a smart card according to another specific embodiment of the present invention.

Referring to FIG. 6 and FIG. 7, the IC chip 134 is preferably disposed on the first side S1, that is, the side facing the smart card 230. The first side S1 has a double-sided tape (such as 3M thin-film VHB tape F-9460PC) for adhering to the surface of the smart card 230. Once the IC film 130 is affixed to the smart card 230, the IC chip 134 will lie completely outside the surface of the smart card 230. In doing so, although the IC chip 134 is not covered with any package molding material, the IC chip 134 is protected by the smart card 230, the FPC board 132, and the surrounding first electrical contacts C1. However, the aforesaid disclosure does not limit the present invention, as it is also feasible for the IC chip 134 to be disposed on the second side S2.

The IC chip 134 is directly bonded to the leads 133 of the FPC board 132 by means of an anisotropic conductive film (ACF). Alternatively, the IC chip 134 is bonded to the leads 133 of the FPC board 132 by means of gold-to-gold interconnection (GGI). In this embodiment, the IC chip 134 is not covered with any package molding material (such as epoxy resin). Preferably, the IC chip 134 is only coated with a UV adhesive layer for enhancing fixation, thereby reducing the thickness of the IC chip 134 greatly. As a result, it is not necessary to perform additional processing work (such as punching a hole in the smart card or cutting the smart card) on the smart card 230 when the IC film 130 is affixed to the smart card 230. The aforesaid disclosure should not limit the present invention, as the integrated circuit chip 134 may also be covered with a package molding material. If the IC chip 134 is covered with a package molding material, it will be feasible for the IC chip 134 to be bonded to the leads 133 of the FPC board 132 by means of a solder ball array instead of the aforesaid anisotropic conductive film (ACF) or gold-to-gold interconnection (GGI).

Third Embodiment

Figure 8:
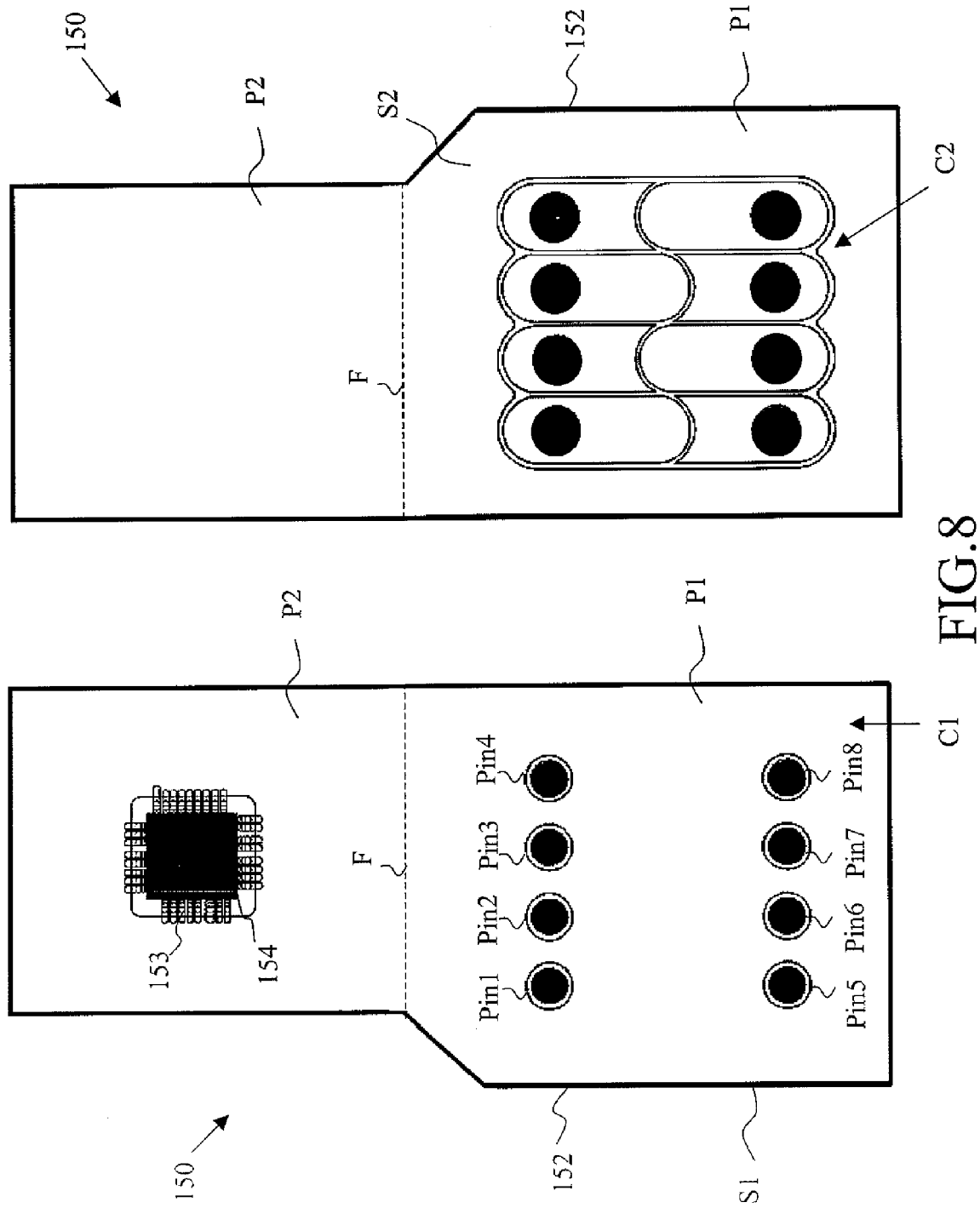
FIG. 8 is a schematic view of an IC film according to yet another specific embodiment of the present invention.

FIG. 8 shows a front view and a back view of an IC film 150 according to an embodiment of the present invention. The IC film 150 comprises a flexible printed circuit (FPC) board 152, the first electrical contacts C1, the second electrical contacts C2, and the IC chip 154. The FPC board 152 has the first side S1 and the second side S2 opposite the first side S1. The FPC board 152 further has a flexible portion S, a first portion P1, and a second portion P2. The first portion P1 and the second portion P2 are positioned on two sides of the flexible portion S. The first electrical contacts C1 are disposed on the first side S1 and positioned at the first portion P1. The second electrical contacts C2 are disposed on the second side S2 and positioned at the first portion P1 to thereby oppose the first electrical contacts C1.

In this embodiment, the first electrical contacts C1 on the first side S1 each have a convex-point structure for electrical connection with a smart card 250 (shown in FIG. 9 and FIG. 10), and the second electrical contacts C2 on the second side S2 each have a concave-point structure, with both structures being located at corresponding positions on the FPC board 152.

In this embodiment, the IC chip 154 is disposed on the first side S1 of the FPC board 152, positioned at the second portion P2, and bonded to leads 153 of the FPC board 152 to thereby form electrical connection.

However, the aforesaid disclosure does not limit the present invention. In other embodiments not shown, the first electrical contacts C1 and the second electrical contacts C2 can be located at different positions in the first portion P1 or can be of different shapes and structures, provided that: the first electrical contacts C1 can be in electrical contact with the intended smart card; and the second electrical contacts C2 can be in electrical contact with an access device (not shown) for use with the smart card.

Preferably, as shown in FIG. 8, the structure and position of the first electrical contacts C1 conform to the ISO7816-2 standard, such that the first electrical contacts C1 can be electrically connected to the smart card in accordance with the ISO7816 standard. Also, the structure and position of the second electrical contacts C2 conform to the ISO7816-2 standard, such that the second electrical contacts C2 can be electrically connected to an access device (such as a smart card reader or a SIM/USIM card slot of a mobile phone) for use with the smart card in accordance with the ISO7816 standard.

Figure 9:
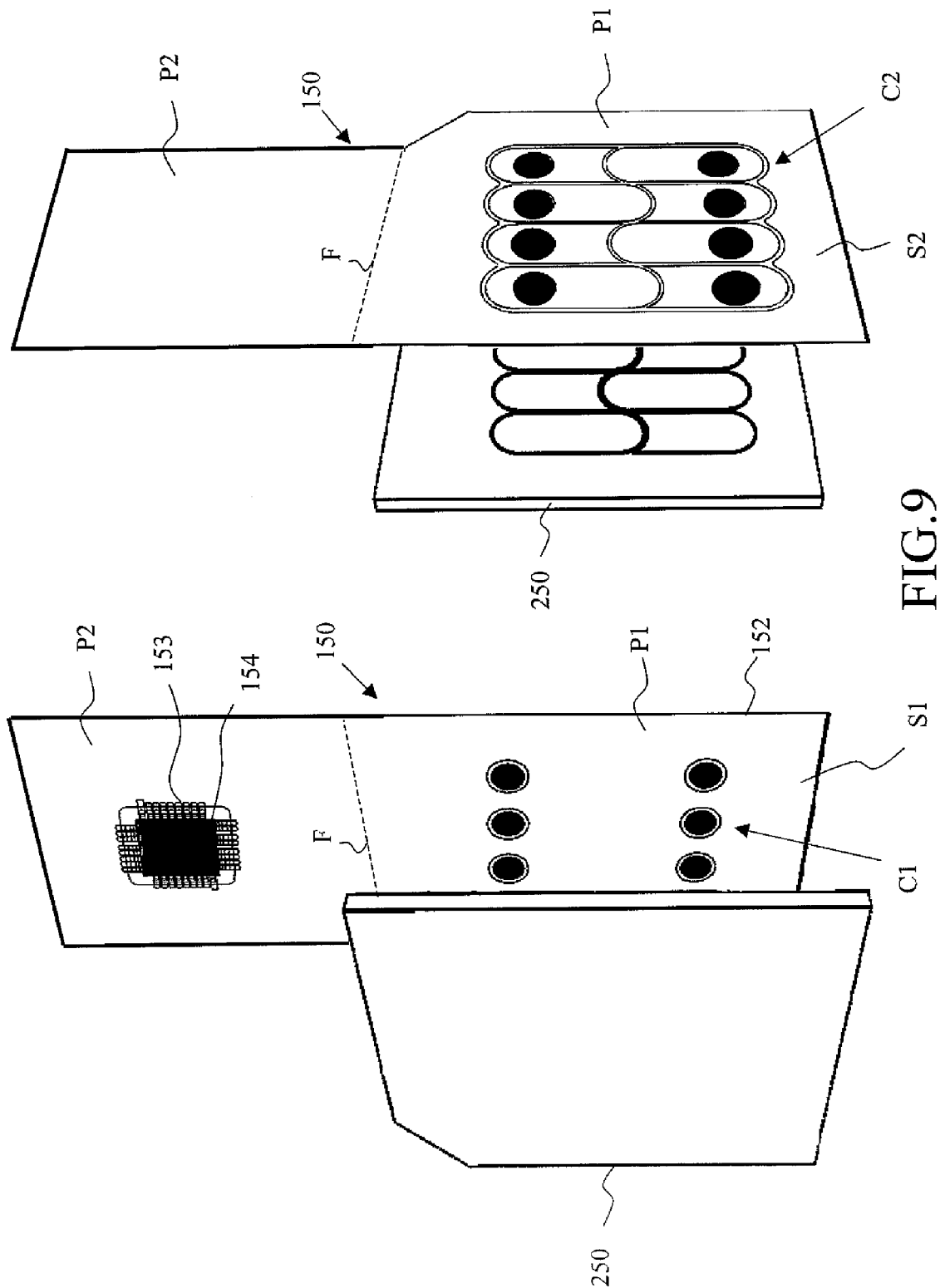
FIG. 9 is a schematic view of an IC film and a smart card according to yet another specific embodiment of the present invention.
Figure 10:
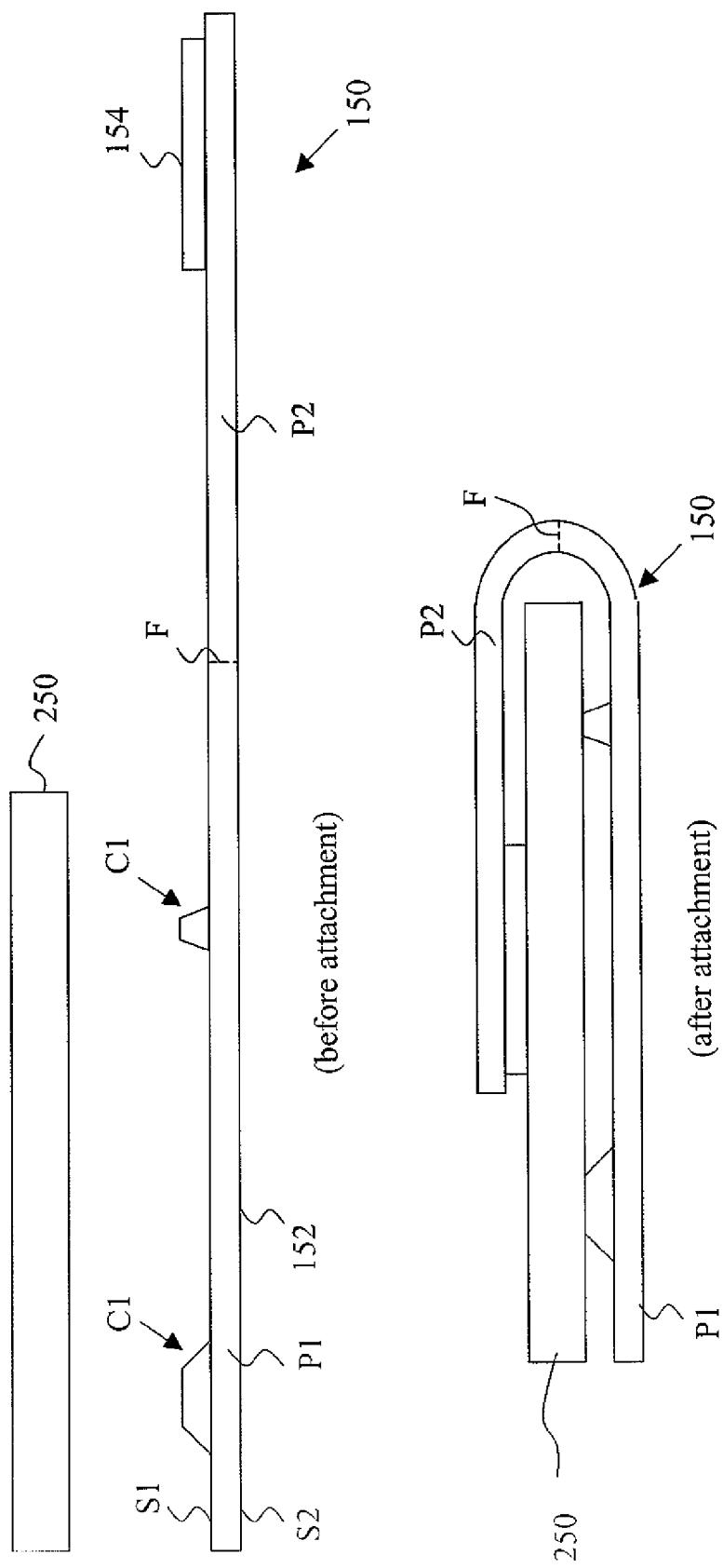
FIG. 10 is a side view of an IC film and a smart card according to yet another specific embodiment of the present invention.

As shown in FIG. 9 and FIG. 10, the IC chip 154 is preferably disposed on the first side S1, that is, the side facing the smart card 250, positioned at the second portion P2, and separated by a flexible portion F from the first portion P1 at which the first electrical contacts C1 and the second electrical contacts C2 are positioned.

Referring to FIG. 7, the flexible portion F bends the FPC board 152 until the FPC board 152 is C-shaped, and the first portion P1 and the second portion P2 are disposed on two opposing sides of the smart card 250, respectively. The dimensions of the first portion P1 and the second portion P2 are not larger than that of the smart card 250, as shown in FIG. 9 and FIG. 10, so as to facilitate insertion of the smart card 250 into the slot (such as the slot 352 shown in FIG. 8).

Once the IC film 150 is affixed to the smart card 250, the IC chip 154 will lie completely outside the surface of the smart card 250. In doing so, although the IC chip 154 is not covered with any package molding material, the IC chip 154 is protected by the smart card 250 and the FPC board 152.

The IC chip 154 is directly bonded to the leads 153 of the FPC board 152 by means of an anisotropic conductive film (ACF). Alternatively, the IC chip 154 is bonded to the leads 153 of the FPC board 152 by means of gold-to-gold interconnection (GGI). In this embodiment, the IC chip 154 is not covered with any package molding material (such as epoxy resin). Preferably, the IC chip 154 is only coated with a UV adhesive layer for enhancing fixation, thereby reducing the thickness of the IC chip 154 greatly. As a result, it is not necessary to perform additional processing work (such as punching a hole in the smart card or cutting the smart card) on the smart card 250 when the IC film 150 is affixed to the smart card 250. The aforesaid disclosure should not limit the present invention, as the IC chip 154 may also be covered with a package molding material. If the IC chip 154 is covered with a package molding material, it will be feasible for the IC chip 154 to be bonded to the leads 153 of the FPC board 152 to form electrical connection by means of a solder ball array instead of the aforesaid anisotropic conductive film (ACF) or gold-to-gold interconnection (GGI).

However, in another embodiment, when the IC film 150 is affixed to the smart card 250, the IC chip 154 and the first electrical contacts C1 are disposed on two opposing sides of the smart card 250, wherein the side of the smart card 250 facing the IC chip 154 does not need electrical contact and thus can be relatively spacious. Hence, there is a relatively large allowable tolerance of the thickness of the IC chip 154, and the IC chip 154 can even be covered with a package molding material.

Mobile Communication Device

Figure 11:
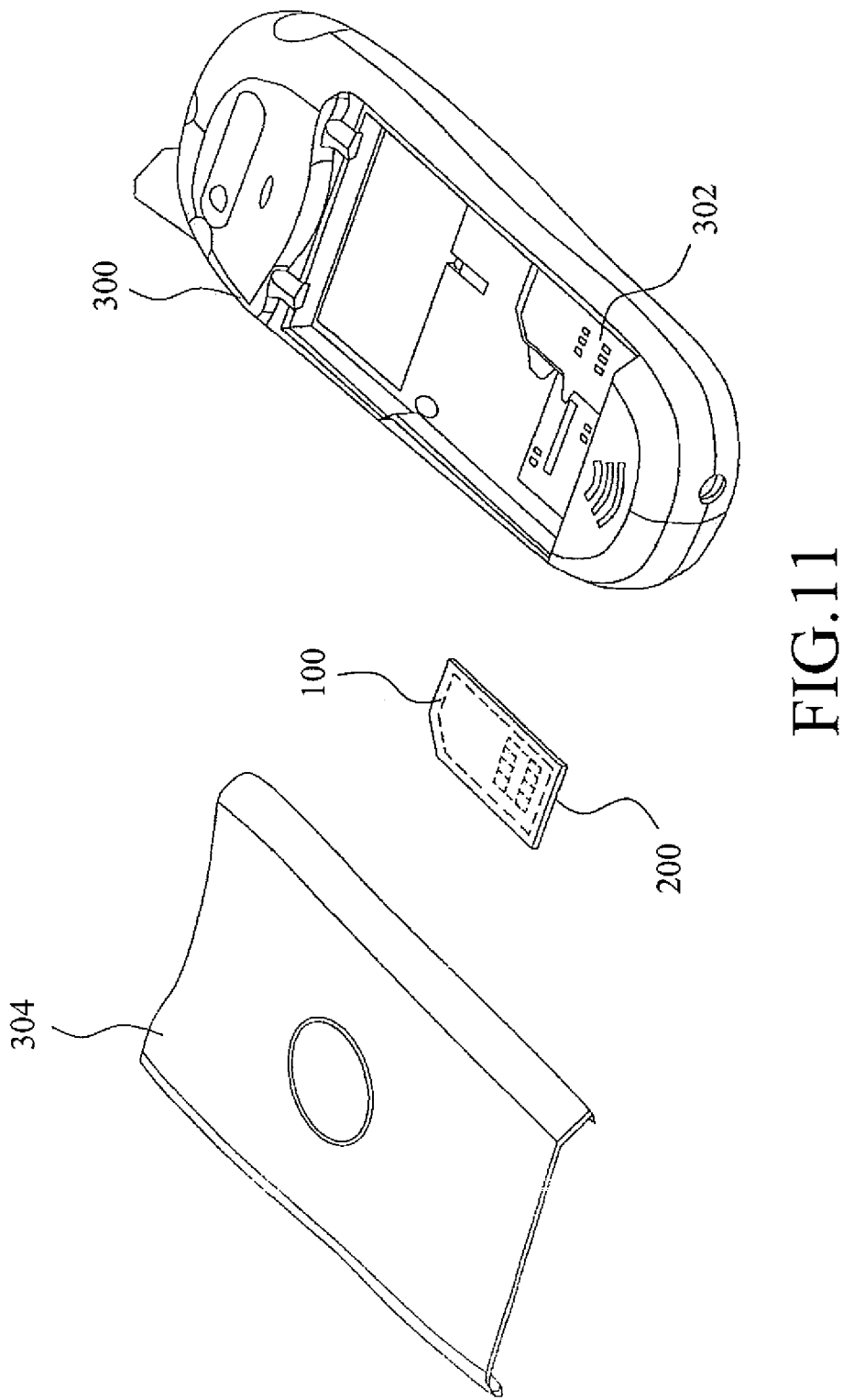
FIG. 11 is a schematic view of a mobile communication device according to a specific embodiment of the present invention.

FIG. 11 is a schematic view of a mobile communication device 300 (such as a mobile phone) according to an embodiment of the present invention. As shown in FIG. 11, the mobile communication device 300 comprises a SIM/USIM card slot 302, a battery lid 304, the smart card 200 (such as SIM/USIM/UIM/RUIM/micro SIM) for use with the mobile communication device 300, and the IC film 100 affixed to the smart card 200, as shown in FIG. 3 and FIG. 4. The SIM/USIM card 200 and the IC film 100 affixed thereto are jointly inserted into the slot 302, such that data stored in the SIM/USIM card 200 and the IC film 100 can be accessed by the slot 302. Then, the user selects the STK options of the mobile communication device 300, so as to use the functions and communication services additionally provided by the IC film 100. For further details about the functions and communication services additionally provided by the IC film 100, please refer to the patent-related or patent application-related documents pertaining to the aforesaid prior art. Also, persons skilled in the art should be able to understand that the smart card 200 and the IC film 100 shown in FIG. 11 may be replaced by the smart card 230 and the IC film 130 shown in FIG. 6 and FIG. 7, respectively, or by the smart card 250 and the IC film 150 shown in FIG. 9 and FIG. 10.

A point to note is that the smart cards disclosed in the present invention include IC cards that conform to the ISO7816 standard; for further details about the smart cards, please refer to regulations (ETSI-TS-102-221) of European Telecommunications Standards Institute (ETSI) regarding smart cards, UICC-Terminal interface, and physical and logical characteristics. The smart cards disclosed in the present invention are not limited to SIM/USIM/UIM/RUIM/Micro SIM cards for use with mobile phones. For further details regarding an example of application of the smart card, please refer to http://www.smartcardalliance.org. In this regard, the present invention imposes no limitations upon the application of the smart card.

The present invention can be embodied in other specific forms without departing from the spirit embodied or essential technical features disclosed in the present invention. The various aspects of the aforesaid specific embodiments should be deemed to be illustrative rather than restrictive of the present invention. Hence, the scope of the present invention is defined by the appended claims rather than by the aforesaid descriptions. All the equivalent meanings that fall within the scope of the claims and all amendments to the claims shall be deemed to be falling within the scope of the claims.

What is claimed is:

1. An integrated circuit (IC) film for a smart card, the IC film comprising:
    a flexible printed circuit (FPC) board having a first side and a second side opposite the first side;
    a plurality of first electrical contacts disposed on the first side and configured for electrical connection with the smart card;
    a plurality of second electrical contacts disposed on the second side; and
    an IC chip disposed on the FPC board, bonded to leads of the FPC board, and thus electrically connected to the first electrical contacts and the second electrical contacts;
    wherein the FPC board and the IC chip have a total thickness not larger than 0.5 mm.

2. The IC film of claim 1, wherein the IC chip is disposed on the first side.

3. The IC film of claim 1, wherein the IC chip is bonded to the leads of the FPC board by means of an anisotropic conductive film (ACF).

4. The IC film of claim 1, wherein the IC chip is bonded to the leads of the FPC board by means of gold-to-gold interconnection (GGI).

5. The IC film of claim 1, wherein the IC chip is not covered with any package molding material.

6. The IC film of claim 1, wherein the IC chip is covered with a package molding material.

7. The IC film of claim 1, wherein the IC chip is coated with a UV adhesive layer.

8. The IC film of claim 1, wherein the FPC board is of a thickness not larger than 0.2 mm.

9. The IC film of claim 1, wherein a total thickness of the FPC board and the IC chip is not larger than 0.4 mm.

10. An integrated circuit (IC) film for a smart card, the IC film comprising:
    a flexible printed circuit (FPC) board having a first side and a second side opposite the first side;
    a plurality of first electrical contacts disposed on the first side, wherein the first electrical contacts comprise at least two contacts;
    a plurality of second electrical contacts disposed on the second side; and
    an IC chip disposed on the first side, disposed between and surrounded by at least two said first electrical contacts, and bonded to leads of the FPC board to thereby form electrical connection with the first electrical contacts and the second electrical contacts.

11. The IC film of claim 10, wherein the first electrical contacts are of structures in accordance with the ISO7816-2 standard, are disposed in accordance with the ISO7816-2 standard, and include eight contacts denoted by pins 1-8, wherein the IC chip is positioned at a region between the contact pins 1-4 and the contact pins 5-8.

12. The IC film of claim 10, wherein a total thickness of the FPC board and the IC chip is not larger than 0.5 mm.

13. The IC film of claim 10, wherein the IC chip is not covered with any package molding material.

14. The IC film of claim 10, wherein the IC chip is coated with a UV adhesive layer.

15. The IC film of claim 10, wherein the at least two first electrical contacts are disposed adjacent two opposing edges of the IC chip.

16. An integrated circuit (IC) film for a smart card, the IC film comprising:
    a flexible printed circuit (FPC) board having a first side and a second side opposite the first side, having a flexible portion, and having a first portion and a second portion on two sides of the flexible portion, respectively, wherein, when the IC film is affixed to the smart card, the flexible portion bends the FPC board until the FPC board is C-shaped, and the first portion and the second portion are disposed on two opposing sides of the smart card, respectively;

a plurality of first electrical contacts disposed on the first side and positioned at the first portion;

a plurality of second electrical contacts disposed on the second side and positioned at the first portion; and an IC chip disposed on the first side, positioned at the second portion, and bonded to leads of the FPC board to thereby form electrical connection with the first electrical contacts and the second electrical contacts.

17. The IC film of claim 16, wherein the first electrical contacts each have a convex-point structure for electrical connection with the smart card.

18. The IC film of claim 16, wherein a total thickness of the FPC board and the IC chip is not larger than 0.5 mm.

19. The IC film of claim 16, wherein the IC chip is not covered with any package molding material.

20. The IC film of claim 16, wherein the IC chip is coated with a UV adhesive layer.

* * * * *